(12) United States Patent
Berke et al.

(10) Patent No.: US 9,929,856 B1
(45) Date of Patent: Mar. 27, 2018

(54) SYSTEM AND METHOD FOR JITTER NEGATION IN A HIGH SPEED SERIAL INTERFACE

(71) Applicant: DELL PRODUCTS, LP, Round Rock, TX (US)

(72) Inventors: Stuart Allen Berke, Austin, TX (US); Bhyrav M. Mutnury, Round Rock, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 0 days.

(21) Appl. No.: 15/345,119

(22) Filed: Nov. 7, 2016

(51) Int. Cl.
*H04L 7/00* (2006.01)
*G01R 31/317* (2006.01)

(52) U.S. Cl.
CPC ...... *H04L 7/0033* (2013.01); *G01R 31/31709* (2013.01); *G01R 31/31715* (2013.01)

(58) Field of Classification Search
CPC ............ H04L 7/0033; G01R 31/31715; G01R 31/31709
See application file for complete search history.

(56) References Cited

U.S. PATENT DOCUMENTS

| | | | | |
|---|---|---|---|---|
| 2004/0008762 | A1* | 1/2004 | Garlett | H04B 17/101 375/224 |
| 2004/0177301 | A1* | 9/2004 | Tarango | H04L 1/244 714/738 |
| 2005/0079822 | A1* | 4/2005 | Boose | G01R 31/31716 455/67.11 |
| 2006/0184332 | A1* | 8/2006 | Ishida | G01R 31/31716 702/69 |
| 2007/0100596 | A1* | 5/2007 | Hollis | G06F 17/5036 703/14 |
| 2007/0133119 | A1* | 6/2007 | Kim | G11B 21/12 360/75 |
| 2007/0147491 | A1 | 6/2007 | Casper et al. | |
| 2008/0192814 | A1* | 8/2008 | Hafed | G01R 31/31711 375/224 |
| 2008/0226288 | A1* | 9/2008 | Miller | H04B 10/073 398/9 |
| 2010/0231233 | A1* | 9/2010 | Dasnurkar | G01R 29/26 324/613 |
| 2010/0332931 | A1* | 12/2010 | Stephens | G01R 31/3171 714/738 |
| 2014/0098843 | A1 | 4/2014 | Kong et al. | |

\* cited by examiner

*Primary Examiner* — Kenneth Lam
(74) *Attorney, Agent, or Firm* — Larson Newman, LLP

(57) ABSTRACT

A serial data channel includes a transmitter with a jitter generator that receives a jitter setting and injects a timing delay into an output signal of the transmitter in response to the jitter setting. The serial data channel further includes a receiver with an eye detector configured to evaluate a signal eye of the received output signal. The serial data channel provides a plurality of jitter settings to the jitter generator, and evaluates a plurality of signal eyes of the received output signal, where each signal eye of the plurality of signal eyes being associated with a particular received output signal generated in response to a particular one of the plurality of jitter settings. The serial data channel further selects a particular jitter setting of the plurality of jitter settings based upon the evaluation of the associated received output signal.

20 Claims, 4 Drawing Sheets

SYSTEM AND METHOD FOR JITTER NEGATION IN A HIGH SPEED SERIAL INTERFACE

FIELD OF THE DISCLOSURE

This disclosure generally relates to information handling systems, and more particularly relates to jitter negation for improved channel performance in a high speed serial interface.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

SUMMARY

A serial data channel can includes a transmitter and a receiver. The transmitter may include a jitter generator that can receive a jitter setting and inject a timing delay into an output signal of the transmitter in response to the jitter setting. The receiver can include an eye detector that can evaluate a signal eye of the received output signal. The serial data channel can provide a plurality of jitter settings to the jitter generator, and evaluate a plurality of signal eyes of the received output signal, where each signal eye of the plurality of signal eyes being associated with a particular received output signal generated in response to a particular one of the plurality of jitter settings. The serial data channel can further select a particular jitter setting of the plurality of jitter settings based upon the evaluation of the associated received output signal.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
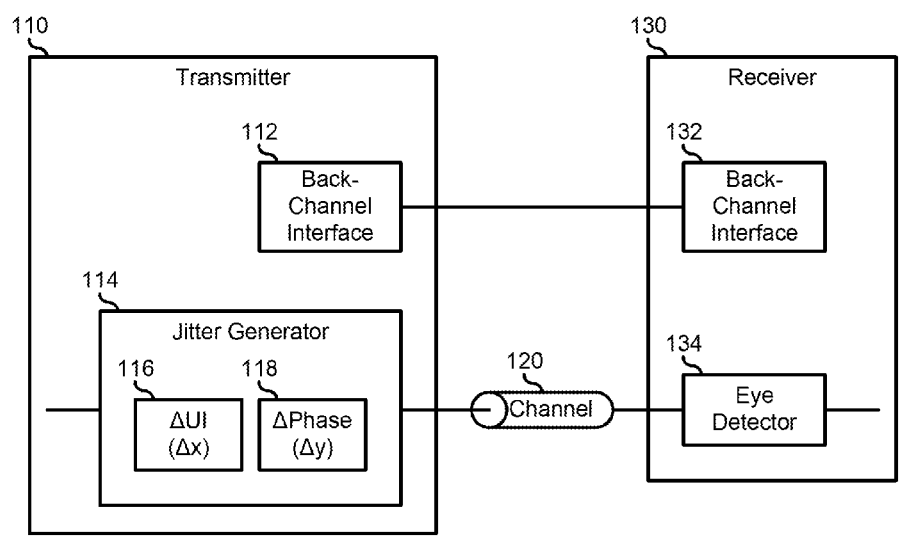
FIG. 1 is a block diagram illustrating a high speed serial channel according to an embodiment of the present disclosure.

FIG. 1 illustrates an embodiment of a high speed serial channel 100 of an information handling system. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

Serial channel 100 includes a transmitter (TX) 110, a transmission channel 120, and a receiver (RX) 130. Serial channel 100 represents one half of a bi-directional serial data link for communicating data from transmitter 110 located at a first component to receiver 130 located at a second component. The other half of the bi-directional serial data link is similar to serial channel 100, but with a receiver in the first component, and a transmitter in the second component, for communicating data back from the second component to the first component. Here, the components can be understood to include elements within an information handling system, such as components that are attached to one or more printed circuit board of the information handling system, where transmission channel 120 can represent one or more circuit traces on the printed circuit board, and can include one or more connectors. The components can also be understood to include devices of an information handling system, such as a hard drive, a storage array, and the like, that are separate from the printed circuit board of the information handling system, where transmission channel 120 can include one or more transmission cables. An example of serial channel 100 may include a PCI-Express (PCIe) channel that is in compliance with an advanced PCIe specification, up to, and beyond the PCIe 4.0 Specification, a Serial ATA (SATA) channel that is in compliance with one or more SATA specification, up to, and beyond the SATA 3.2 Specification, an Ethernet channel including a 1000BASE-T channel, or beyond, or another high speed serial channel.

As the speed of high speed serial interfaces increases, maintaining good signal integrity across the channel becomes an increasingly difficult problem. Transmitter 110 includes a back-channel interface 112 and a jitter generator 114, and receiver 130 includes a back-channel interface 132 and an eye detector 134. Serial channel 100 operates to provide back-channel adaptation where transmitter 110 and receiver 130 communicate with each other via back-channel interfaces 112 and 132 to optimize and adjust various compensation values within the transmitter and the receiver to compensate for the insertion loss and cross-talk on transmission channel 120. In a particular embodiment, back-channel interfaces 112 and 132 represent a separate communication channel between transmitter 110 and receiver 130. In another embodiment, back-channel interfaces 112 and 132 represent a communication channel between transmitter 110 and receiver 130 that is established on another serial channel that is the other half of a bi-directional serial data link. In yet another embodiment, back-channel interfaces 112 and 132 represent a serial channel between transmitter 110 and receiver 130 that is part of a different bi-directional serial data link.

A determination is made as to whether or not a set of compensation values is satisfactory based upon a determination of the bit error rate (BER) associated with the set of values. It is possible for multiple different sets of compensation values to result in acceptable BER in serial channel 100. Thus, when a particular set of compensation values is obtained through the back-channel adaptation, serial channel 100 further operates to adjust the particular set of compensation values to lower the settings of compensation mechanisms that are known to consume a greater amount of power, and to adjust other mechanisms to correct for the lowered settings, thereby reducing the power consumption of serial channel 100, while maintaining an acceptable BER. Eye detector 134 operates to detect the signal eye generated at receiver 130 in response to the various compensation values, and to provide for the determination of the BER associated with the various compensation values.

Serial channel 100 experiences various deviations from true periodicity in both the signals transmitted by transmitter 110 and the signals received by receiver 130. Such deviations include random jitter, the Gaussian white noise produced within the elements of serial channel 100, and deterministic jitter, the noise produced by deterministic causes. Deterministic jitter includes periodic jitter, or sinusoidal jitter, inter-symbol interference, duty cycle distortion, and echo jitter. Periodic jitter may be related to various data patterns transmitted by serial channel 100, to ground bounce in the circuits of the serial channel, or power supply variations in the serial channel. Inter-symbol interference is related to signal distortion when a signal bit is surrounded by signal bits of the opposite signal state, and may be caused by bandwidth limitations in transmission channel 120. Duty cycle distortion is related to asymmetries in signal states, such as where transitions from logic "0" to logic "1" have different durations than transitions from logic "1" to logic "0", and which may by improper bias settings or insufficient power supply capacities to the elements of serial channel 100. Echo jitter is caused by mismatched components and trace lengths in the elements of serial channel 100.

Jitter generator 114 represents hardware functions of transmitter 110 that operate to inject jitter, in the form of various timing shifts, into the signal states transmitted by transmitter 110. Eye detector 134 then detects the signal eye generated at receiver 130 in response to the various timing shifts, and determines a set of timing shifts that contribute to a better BER for serial channel 100. After determining the set of timing shifts, serial channel 100 performs back-channel adaptation as described above. Jitter generator 114 includes a unit interval change (AUI) generator 116 and a phase change (APhase) generator 118.

Figure 2:
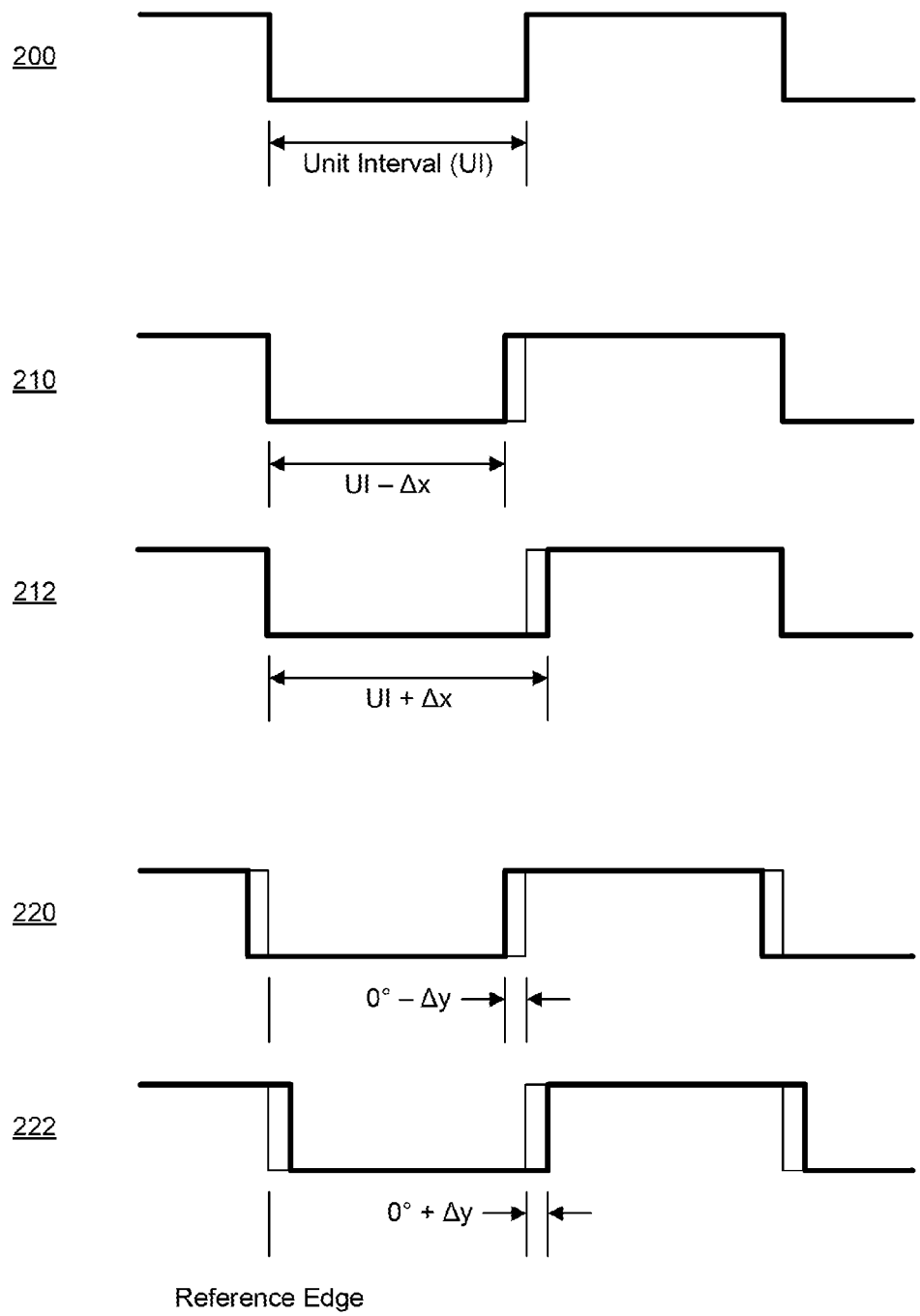
FIG. 2 illustrates transmitter signals according to an embodiment of the present disclosure.

FIG. 2 illustrates a transmitter signal of transmitter 110, as modified by the action of unit interval change generator 116 and phase change generator 118. In particular, an unmodified transmitter signal 200 has a unit interval (UI). The UI of unmodified transmitter signal 200 is determined by the bandwidth of serial channel 100. Note that serial channel 100 may have different operating modes that are each associated with a different bandwidth. Thus unmodified transmitter signal 200 is understood to be a generalized depiction of the unit interval of any of the various operating modes. Unit interval change generator 116 operates to modify the UI of one of the state transitions (i.e., low-to-high or high-to-low) in the transmitter signal of transmitter 110. Here, unit interval change generator 116 operates to incrementally change the effective UI for the particular state transition. For example, unit interval change generator 116 provides an accelerated transition transmitter signal 210, where the low-to-high transition occurs at a time equal to:

$$UI_{\mathit{eff}} = UI - A\Delta x, (A=0,1,2,\ldots,p) \qquad \text{Equation 1}$$

where $UI_{\mathit{eff}}$ is an effective UI for the low-to-high transition, $\Delta x$ is an increment by which the unit interval change generator accelerates the low-to-high transition, A is an integer number of increments of $\Delta x$ by which the low-to-high transition is accelerated, and p is a maximum number of increments by which the unit interval change generator can accelerate the low-to-high transition. Further, unit interval change generator 116 provides a decelerated transition transmitter signal 212, where the low-to-high transition occurs at a time equal to:

$$UI_{\mathit{eff}} = UI + A\Delta x, (A=1,2,\ldots,q) \qquad \text{Equation 2}$$

where q is a maximum number of increments by which the unit interval change generator can decelerate the low-to-high transition. As such, unit cell change generator 116 has:

$$(p+q+1) \qquad \text{Equation 3}$$

settings by which the low-to-high transition may be incremented. Note that $\Delta x$ can be defined by a unit of time, by a percentage, or by another value that provides an increment for accelerating or decelerating the low-to-high transition. In another embodiment, unit cell change generator 116 operates to change the high-to-low transition UI instead of the low-to-high transition UI.

Phase change generator 118 operates to incrementally shift the phase of the UI of the transmitter signal of transmitter 110. For example, phase change generator 118 provides an accelerated phase transmitter signal 220, where the phase of the transmitter signal is:

$$\text{Phase}_{\textit{eff}} = 0° - B\Delta y, (B = 0, 1, 2, \ldots, r) \quad \text{Equation 4}$$

where $\text{Phase}_{\textit{eff}}$ is an effective phase for the transmitter signal, $\Delta y$ is an increment by which the phase change generator accelerates the phase of the transmitter signal, B is an integer number of increments of $\Delta y$ by which the phase is accelerated, and r is a maximum number of increments by which the phase change generator can accelerate the phase of the transmitter signal. Further, phase change generator 118 provides a decelerated phase transmitter signal 222, where the phase of the transmitter signal is:

$$\text{Phase}_{\textit{eff}} = 0° + B\Delta y, (B = 1, 2, \ldots, s) \quad \text{Equation 5}$$

where s is a maximum number of increments by which the phase change generator can decelerate the phase of the transmitter signal. As such, phase change generator 116 has:

$$(r + s + 1) \quad \text{Equation 6}$$

settings by which the low-to-high transition may be incremented. Note that $\Delta y$ can be defined by a unit of time, by a percentage, by a phase in degrees, or by another value that provides an increment for accelerating or decelerating the phase.

Figure 3:
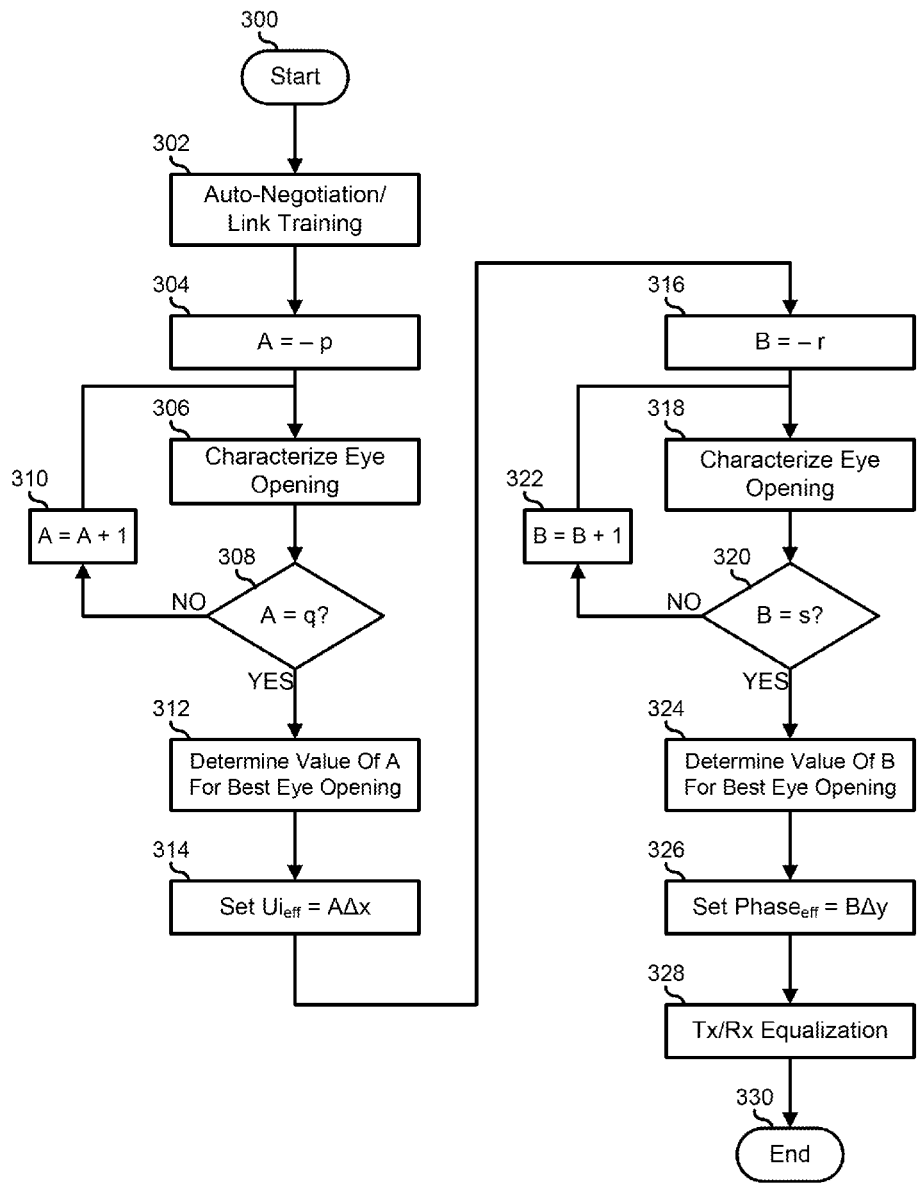
FIG. 3 is a flowchart illustrating a method of jitter negation for improved channel performance in a high speed serial interface according to an embodiment of the present disclosure.

FIG. 3 illustrates a method of jitter negation for improved channel performance in a high speed serial interface starting at block 300. An auto-negotiation and link training of a high speed serial interface is initiated at block 302. For example, a high speed serial link can conduct auto-negotiation and link training per an associated specification, such as a PCI-Express (PCIe) channel that is in compliance with an advanced PCIe specification, a Serial ATA (SATA) channel that is in compliance with one or more SATA specification, or an Ethernet channel specification. A knob setting for a unit interval change generator in a transmitter is set to its lowest setting, such that a particular signal transition is accelerated by a maximum number of increments, $\Delta x$, in block 304. For example, unit interval change generator 116 can be set such that:

$$UI_{\textit{eff}} = UI - p\Delta x \quad \text{Equation 7}$$

An eye opening for the serial data signal provided by the transmitter is characterized in a receiver in block 306. For example, eye detector 134 can determine the characteristics of the eye opening that results from the transmitter signal as modified in block 304. In particular, an eye height, an eye width, or another characteristic of the signal eye can be captured by eye detector 134. A decision is made as to whether or not the knob setting for the unit interval change generator is set to its highest setting, such that a particular signal transition is decelerated by a maximum number of increments, $\Delta x$, in decision block 308. For example, a decision can be made as to whether or not unit interval change generator 116 is set such that:

$$UI_{\textit{eff}} = UI + q\Delta x \quad \text{Equation 8}$$

If not, the "NO" branch of decision block 308 is taken, the knob setting for the unit interval change generator is set to a next higher setting in block 310, and the method returns to block 306 where the eye opening for the serial data signal provided by the transmitter is re-characterized.

If the knob setting for the unit interval change generator is set to its highest setting, the "YES" branch of decision block 308 is taken, the receiver determines a value for the setting for the unit interval change generator that generated a best eye opening, as characterized in block 306, and sends the setting information to the transmitter in block 312. For example, receiver 130 can evaluate the eye characteristics for the eyes characterized by eye detector 134 in block 306, can select a "best" eye, and can communicate which delay setting generated the best eye to transmitter 110 via back channel interfaces 112 and 132. A best eye can be determined based upon a maximum value for an eye height or eye width, based upon a highest average value for a product of the eye height and eye width, or based upon another characteristic of the eyes generated by eye detector 134. The unit interval change generator is set with the delay setting that produced the best eye in block 314.

A knob setting for a phase change generator in a transmitter is set to its lowest setting, such that the phase of the signal transmitted by the transmitter is accelerated by a maximum number of increments, $\Delta y$, in block 316. For example, phase change generator 118 can be set such that:

$$\text{Phase}_{\textit{eff}} = 0° - r\Delta y \quad \text{Equation 9.}$$

An eye opening for the serial data signal provided by the transmitter is characterized in a receiver in block 318. For example, eye detector 134 can determine the characteristics of the eye opening that results from the transmitter signal as modified in block 316. A decision is made as to whether or not the knob setting for the phase change generator is set to its highest setting, such that phase of the signal transmitted by the transmitter is decelerated by a maximum number of increments, $\Delta y$, in decision block 320. For example, a decision can be made as to whether or not phase change generator 118 is set such that:

$$\text{Phase}_{\textit{eff}} = 0° + s\Delta y \quad \text{Equation 10.}$$

If not, the "NO" branch of decision block 320 is taken, the knob setting for the phase change generator is set to a next higher setting in block 322, and the method returns to block 316 where the eye opening for the serial data signal provided by the transmitter is re-characterized.

If the knob setting for the phase change generator is set to its highest setting, the "YES" branch of decision block 320 is taken, the receiver determines a value for the setting for the phase change generator that generated a best eye opening, as characterized in block 318, and sends the setting information to the transmitter in block 324. For example, receiver 130 can evaluate the eye characteristics for the eyes characterized by eye detector 134 in block 318, can select a best eye, and can communicate which phase setting generated the best eye to transmitter 110 via back channel interfaces 112 and 132. The phase change generator is set with the phase setting that produced the best eye in block 326. The serial channel continues to determine the transmit and receive side equalization settings in block 328, and the method ends in block 330.

Figure 4:
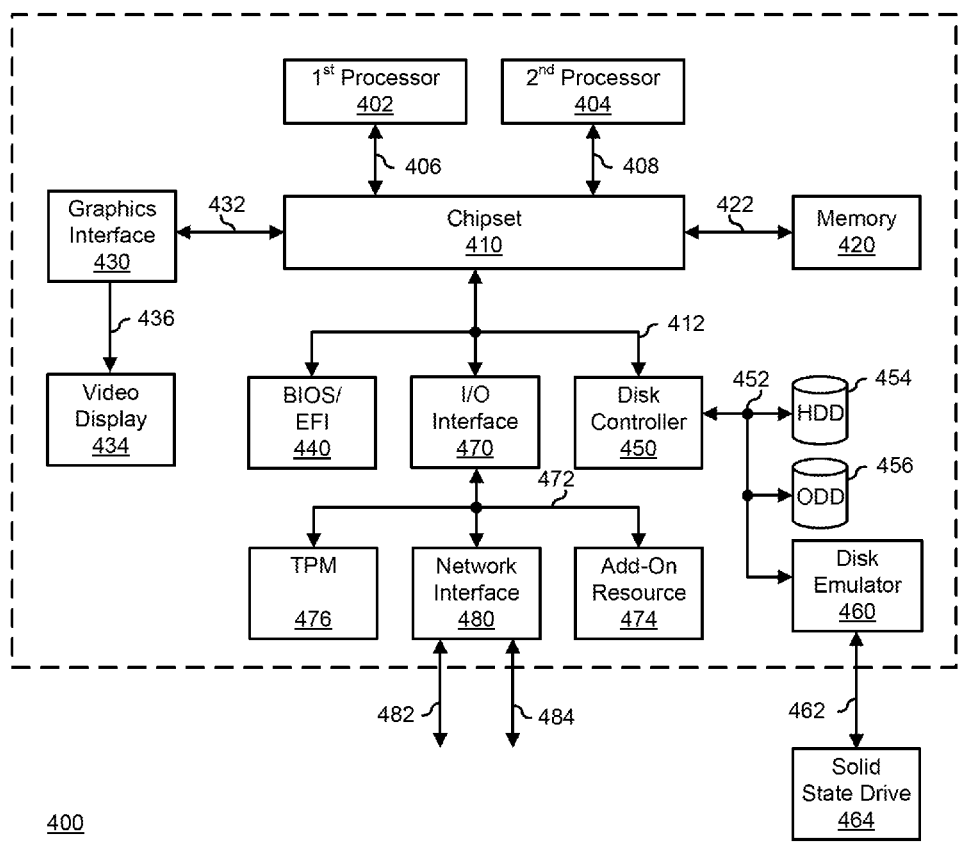
FIG. 4 is a block diagram illustrating a generalized information handling system according to an embodiment of the present disclosure.

FIG. 4 illustrates a generalized embodiment of information handling system 400. For purpose of this disclosure information handling system 400 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described above, and operates to perform one or more of the methods described above. Information handling system 400 includes a processors 402 and 404, a chipset 410, a memory 420, a graphics interface 430, include a basic input and output system/extensible firmware interface (BIOS/EFI) module 440, a disk controller 450, a disk emulator 460, an input/output (I/O) interface 470, and a network interface 480. Processor 402 is connected to chipset 410 via processor interface 406, and processor 404 is connected to the chipset via processor interface 408. Memory 420 is connected to chipset 410 via a memory bus 422. Graphics interface 430 is connected to chipset 410 via a graphics interface 432, and provides a video display output 436 to a video display 434. In a particular embodiment, information handling system 400 includes separate memories that are dedicated to each of processors 402 and 404 via separate memory interfaces. An example of memory 420 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 440, disk controller 450, and I/O interface 470 are connected to chipset 410 via an I/O channel 412. An example of I/O channel 412 includes a Peripheral Component Interconnect (PCI) interface, a PCI-Extended (PCI-X) interface, a high speed PCI-Express (PCIe) interface, another industry standard or proprietary communication interface, or a combination thereof. Chipset 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 440 includes BIOS/EFI code operable to detect resources within information handling system 400, to provide drivers for the resources, initialize the resources, and access the resources. BIOS/EFI module 440 includes code that operates to detect resources within information handling system 400, to provide drivers for the resources, to initialize the resources, and to access the resources.

Disk controller 450 includes a disk interface 452 that connects the disc controller to a hard disk drive (HDD) 454, to an optical disk drive (ODD) 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits a solid-state drive 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O interface 470 includes a peripheral interface 472 that connects the I/O interface to an add-on resource 474, to a TPM 476, and to network interface 480. Peripheral interface 472 can be the same type of interface as I/O channel 412, or can be a different type of interface. As such, I/O interface 470 extends the capacity of I/O channel 412 when peripheral interface 472 and the I/O channel are of the same type, and the I/O interface translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as chipset 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A serial data channel, comprising:
 a transmitter including a jitter generator configured to receive one of a plurality of jitter settings and to inject a timing delay into an output signal of the transmitter in response to the received jitter setting; and
 a receiver configured to receive the output signal from the transmitter, the receiver including an eye detector configured to evaluate a signal eye of the received output signal;
 the serial data channel configured to provide the jitter settings to the jitter generator; and
 the receiver configured to evaluate a plurality of signal eyes of the received output signal, each signal eye being associated with a particular received output signal generated in response to a particular one of the jitter settings, and to select a particular jitter setting based upon the evaluation of the particular received output signal.

2. The serial data channel of claim 1, wherein the serial data channel is further configured to:
 provide, from the receiver to the transmitter, information identifying the particular jitter setting; and
 set the jitter generator with the particular jitter setting.

3. The serial data channel of claim 2, wherein the serial data channel is further configured to:
 train the serial data channel in response to setting the jitter generator with the particular jitter setting.

4. The serial data channel of claim 1, wherein the particular jitter setting is selected when the particular received output signal had a greatest eye height of the plurality of signal eyes.

5. The serial data channel of claim 1, wherein the particular jitter setting is selected when the particular received output signal had a greatest eye width of the plurality of signal eyes.

6. The serial data channel of claim 1, wherein the particular jitter setting is selected when the particular received output signal had a greatest average of a product of an eye height and an eye width of the plurality of signal eyes.

7. The serial data channel of claim 1, wherein the jitter generator includes a unit interval change generator configured to modify a unit interval of a state transition in the output signal of the transmitter based upon the jitter setting.

8. The serial data channel of claim 1, wherein the jitter generator includes a phase change generator configured to modify a phase of the output signal of the transmitter based upon the jitter setting.

9. A method, comprising:
 providing, to a jitter generator of a transmitter of a serial data channel, a plurality of jitter settings, wherein the jitter generator is configured to receive the jitter settings and to inject a timing delay into an output signal of the transmitter in response to the received jitter setting;
 evaluating, by an eye detector of a receiver of the serial data channel, a plurality of signal eyes of a plurality of received output signals from the transmitter, each signal eye being associated with a particular received output signal generated in response to a particular one of the jitter settings; and
 selecting a particular jitter setting based upon the evaluation of the particular received output signal.

10. The method of claim 9, further comprising:
 providing, from the receiver to the transmitter, information identifying the particular jitter setting; and
 setting the jitter generator with the particular jitter setting.

11. The method of claim 10, further comprising:
 training the serial data channel in response to setting the jitter generator with the particular jitter setting.

12. The method of claim 9, wherein the particular jitter setting is selected when the particular received output signal had a greatest eye height of the plurality of signal eyes.

13. The method of claim 9, wherein the particular jitter setting is selected when the particular received output signal had a greatest eye width of the plurality of signal eyes.

14. The method of claim 9, wherein the particular jitter setting is selected when the particular received output signal had a greatest average of a product of an eye height and an eye width of the plurality of signal eyes.

15. The method of claim 9, further comprising:
 modifying, by a unit interval change generator of the jitter generator, a unit interval of a state transition in the output signal of the transmitter based upon the jitter setting.

16. The method of claim 9, further comprising:
 modifying, by a phase change generator of the jitter generator, a phase of the output signal of the transmitter based upon the jitter setting.

17. A non-transitory computer-readable medium including code for performing a method, the method comprising:
 providing, to a jitter generator of a transmitter of a serial data channel, a plurality of jitter settings, wherein the jitter generator is configured to receive the jitter settings and to inject a timing delay into an output signal of the transmitter in response to the received jitter setting;
 evaluating by an eye detector of a receiver of the serial data channel, a plurality of signal eyes of a plurality of received output signals from the transmitter, each signal eye being associated with a particular received output signal generated in response to a particular one of the jitter settings; and
 selecting a particular jitter setting based upon the evaluation of the particular received output signal.

18. The non-transitory computer-readable medium of claim 17, the method further comprising:
 providing, from the receiver to the transmitter, information identifying the particular jitter setting; and
 setting the jitter generator with the particular jitter setting.

19. The non-transitory computer-readable medium of claim 17, the method further comprising:
 modifying, by a unit interval change generator of the jitter generator, a unit interval of a state transition in the output signal of the transmitter based upon the jitter setting.

20. The non-transitory computer-readable medium of claim 17, the method further comprising:
 modifying, by a phase change generator of the jitter generator, a phase of the output signal of the transmitter based upon the jitter setting.

* * * * *